(12) United States Patent
Henseler et al.

(10) Patent No.: US 9,040,898 B2
(45) Date of Patent: May 26, 2015

(54) DEVICE HAVING A PLURALITY OF PHOTOSENSITIVE MICROCELLS ARRANGED IN ROW OR MATRIX FORM

(75) Inventors: Debora Henseler, Erlangen (DE); Meinrad Schienle, Ottobrunn (DE)

(73) Assignee: Siemens Medical Solutions USA, Inc., Malvern, PA (US)

( * ) Notice: Subject to any disclaimer, the term of this patent is extended or adjusted under 35 U.S.C. 154(b) by 196 days.

(21) Appl. No.: 13/819,765

(22) PCT Filed: Aug. 12, 2011

(86) PCT No.: PCT/EP2011/063966
§ 371 (c)(1),
(2), (4) Date: Feb. 28, 2013

(87) PCT Pub. No.: WO2012/028441
PCT Pub. Date: Mar. 8, 2012

(65) Prior Publication Data
US 2013/0153975 A1    Jun. 20, 2013

(30) Foreign Application Priority Data

Sep. 1, 2010  (EP) ................................. 10009073
Sep. 30, 2010  (DE) ...................... 10 2010 041 805

(51) Int. Cl.
*H01L 31/00* (2006.01)
*H01L 27/144* (2006.01)
*G01T 1/24* (2006.01)
*H01L 27/146* (2006.01)

(52) U.S. Cl.
CPC ............ *H01L 27/1443* (2013.01); *G01T 1/248* (2013.01); *H01L 27/14603* (2013.01)

(58) Field of Classification Search
CPC ...................................................... G01T 1/248
USPC ........................................... 250/214 R, 214.1
See application file for complete search history.

(56) References Cited

U.S. PATENT DOCUMENTS 7,402,789 B2 * 7/2008 Bock ........................ 250/214 R
7,602,307 B1 * 10/2009 Brennan et al. ............ 340/686.2
2009/0121142 A1  5/2009 Heismann et al.

FOREIGN PATENT DOCUMENTS

| CN | 101163988 | 4/2008 |
| DE | 102008033960 A1 | 1/2009 |
| WO | 2006111883 A2 | 10/2006 |
| WO | 2009019660 A2 | 2/2009 |

OTHER PUBLICATIONS

Office Action in corresponding Chinese Patent Application No. 201180050100X, dated Jul. 21, 2014, 12 pages, English translation attached.

(Continued)

*Primary Examiner* — Thanh Luu
(74) *Attorney, Agent, or Firm* — Peter Kendall

(57) ABSTRACT

The invention provides a Silicon Photomultiplier (SiPM). The SiPM includes a plurality of microcells, a nonlinear element integrated in each one of the plurality of microcells, and a trigger line for outputting a summated current of the plurality of microcells, wherein the nonlinear element provides for a separated timing and energy signal.

18 Claims, 4 Drawing Sheets

(56) References Cited

OTHER PUBLICATIONS

Frach, et al, "The Digital Silicon Photomultiplier—Principle of Operation and Intrinsic Detector Performance", Nuclear Science Symposium Conference Record (NSS/MIC), 2009 IEEE, vol., No., pp. 1959-1965, Oct. 24, 2009-Nov. 1, 2009.

Nassalski, et al, "Application of Hamamatsu S8550 APD array to the Common PET/CT Detector", Nuclear Science Symposium Conference Record, 2007. NSS '07. IEEE, vol. 5, No., pp. 3309-3313, Oct. 26, 2007-Nov. 3, 2007.

International Search Report in PCT/EP2011/063966 dated Apr. 16, 2012 (14 pages).

* cited by examiner

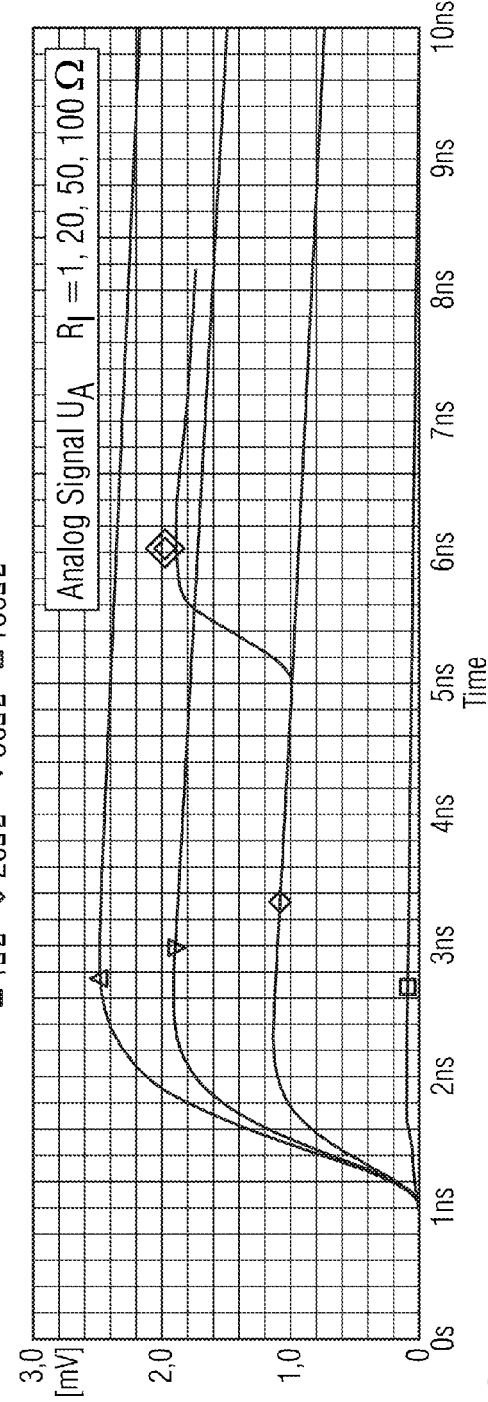
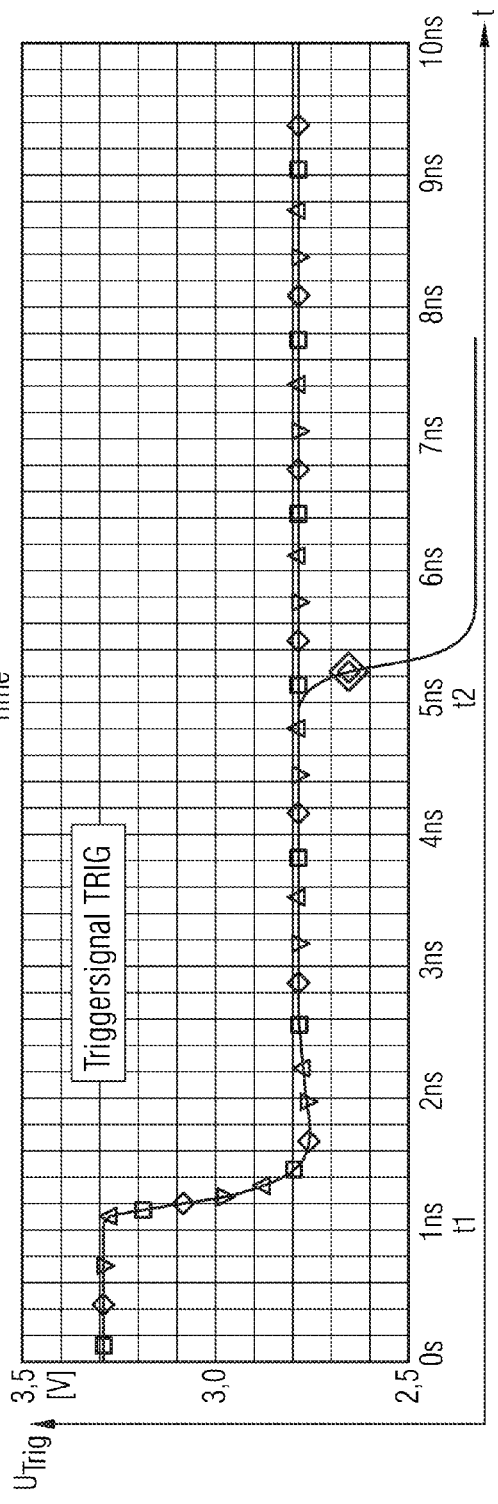
FIG 4A
FIG 4B

DEVICE HAVING A PLURALITY OF PHOTOSENSITIVE MICROCELLS ARRANGED IN ROW OR MATRIX FORM

This application is the U.S. national phase application of PCT International Application No. PCT/EP2011/063966, filed Aug. 12, 2011, which claims priority to European Patent Application No. EP10009073.1, filed Sep. 1, 2010 and German Patent Application No. 102010041805.6, filed Sep. 30, 2010, the contents of such applications being incorporated by reference herein.

The invention relates to a device having a plurality of photosensitive microcells arranged in row or matrix form.

Silicon photomultipliers consist of detector cells or microcells each of which has an avalanche photodiode (APD) and a series resistor. When a feed voltage is applied, the photodiode, which is usually biased in the reverse direction, connects through to some extent upon the arrival of radiation, for example a photon. This effect is amplified by the avalanche effect in the photodiode. At the output of the microcell, i.e. at the node between the resistor and the photodiode, a voltage drop that is caused by the switching through of the photodiode can be measured and evaluated.

WO 2006/111883 A2 discloses an array of detector cells in which every detector cell is designed as an avalanche photodiode. An avalanche photodiode is integrated in a CMOS process. A digital circuit outputs a first value in a resting state and a further other value when the avalanche photodiode detects a photon. A circuit outputs a trigger signal at the start of the integration period as a response to the transition of the cell from one digital value to the other.

T. Frach et al., "Digital Silicon Photo Multiplier—Principle of Operation and Intrinsic Detector Performance", IEEE Nuclear Science Symposium, Talk 29 May 2009 describes a fully digital silicon photomultiplier in which an avalanche photodiode is integrated in a CMOS process. This solution contains an active quenching and a fully digital readout with the disadvantage of higher costs due to a complex production process. Compared with an analog silicon photomultiplier, the timing resolution is improved since the capacitances of the individual microcells are not summed up with each other and the timing trigger is generated directly at cell level.

SUMMARY

The object of the invention consists in making a fast and inexpensive silicon photomultiplier available.

The object is achieved by the features of the independent claims.

Developments of the invention and embodiments are specified in the dependent claims.

It is suggested that an individual non-linear element be integrated in every microcell to obtain the time signal directly from the microcell and evaluate it. This non-linear element is preferably an active element or a bipolar or MOS transistor. It is preferably either an NMOS or a PMOS transistor. This component/device serves as an amplifier that activates a general trigger signal line. The energy or charge signal is evaluated by integrating the summated current of all microcells in the device, as in the prior art of analog silicon photomultiplier devices.

Most applications make use of an analog SiPM (silicon photomultiplier) and derive both the timing and the energy information signals from the same summated signal of all microcells. This is not the optimal configuration for the timing information. The triggering at the first detected photon or photons/quanta is especially difficult. Furthermore, the electronics for the timing trigger need a higher bandwidth than for the energy signal, and this is not optimal in terms of the power consumption.

A digital trigger line is added to the analog silicon photomultiplier so that the timing signal is separated from the energy signal or charge signal. The advantages comprise:
1. Triggering at the first photon is made simpler and more precise than in a purely analog silicon photomultiplier;
2. The energy signal can be evaluated with less electronics, which results in a considerably lower current consumption/power requirement;
3. The technological effort is less than with a fully integrated CMOS process so that production is rendered less expensive.

The invention provides a Silicon Photomultiplier (SiPM). The SiPM includes a plurality of microcells, a nonlinear element integrated in each one of the plurality of microcells, and a trigger line for outputting a summated current of the plurality of microcells, wherein the nonlinear element provides for a separated timing and energy signal.

The invention also provides for a device for detecting radiation. The device includes a plurality of photosensitive microcells arranged in a row or matrix for detecting one or more photons, a plurality of avalanche photodiodes each one of the plurality of photodiodes being associated with a respective photosensitive microcell, a plurality of quenching resistors wherein each quenching resistor is connected in series with a respective one of the plurality of avalanche photodiodes, a plurality of amplifier elements wherein each amplifier element is located between a respective avalanche photodiode and quenching resistor in each one of the plurality of microcells, a first trigger line for detecting at least one time point of an incidence of one or more photons within at least one of the plurality of photosensitive microcells, and a second trigger line for detecting charges that are generated within at least one of the plurality of photosensitive microcells by an incidence of one or more photons.

DRAWINGS

The invention is explained in detail on the basis of the following figures which show, respectively:

FIGS. 4A and 4B are graphs of the results of simulations of the operation of a circuit in accordance with FIG. 2 or 3 in accordance with an embodiment of the present invention.

In the following figures, identical or functionally corresponding units have the same reference symbols. The figures are described jointly in a group.

DETAILED DESCRIPTION

Figure 1:
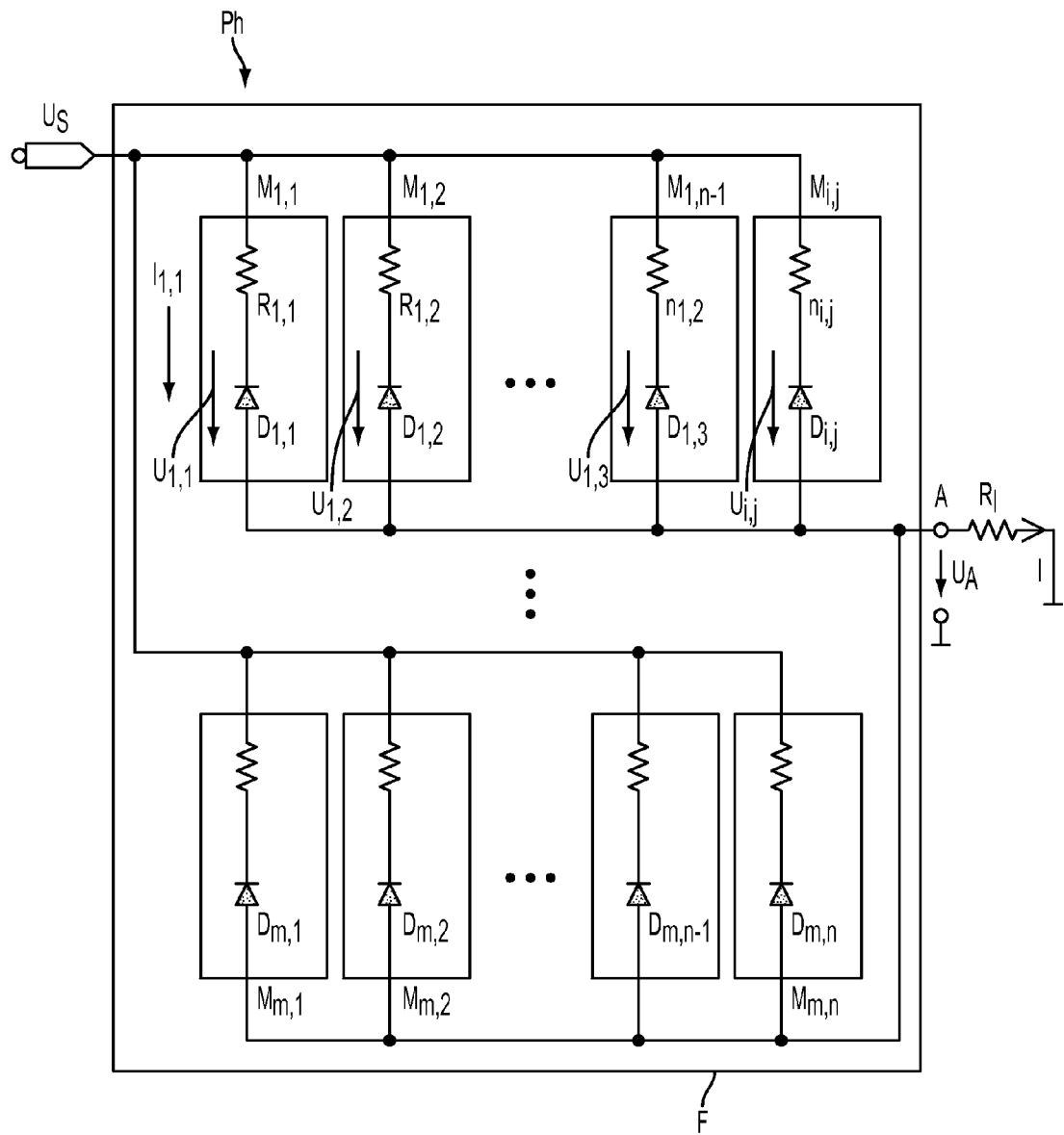
FIG. 1 is a diagram of a silicon photomultiplier in accordance with the prior art

FIG. 1 shows the electrical circuit of a silicon photomultiplier (SiPM) F available in the prior art. A quantity of detector cells or microcells $M_{i,j}$, which have an avalanche photodiode (APD) $D_{i,j}$ and a quenching resistor $R_{i,j}$ connected in series with it, is arranged in a matrix in order to form a photosensitive surface F or a photoelectric device F.

A supply voltage $U_s$ is applied to the detector cells $M_{i,j}$ in the reverse direction, i.e. the positive supply voltage is connected via the quenching resistor $R_{i,j}$ to the cathode of the avalanche photodiode $D_{i,j}$. The detector cells $M_{i,j}$ operate in Geiger mode, i.e. the supply voltage Us is a dc voltage (Bias-Voltage_Bias, operating point/dc voltage point), which is somewhat higher than the breakdown voltage of the avalanche photodiodes $D_{i,j}$. The avalanche effect generated upon the detection of a photon Ph1 is only terminated by the lowering of the bias voltage $UD_{i,j}$ at the avalanche photodiode $D_{i,j}$, which takes place with the aid of the quenching resistor $R_{i,j}$. This event, of the avalanche breakdown, takes place very rapidly. The resetting, or re-charging, of an avalanche photodiode $D_{i,j}$ takes around 100 to 200 μs in this case at a capacitance of the avalanche photodiode of 100 femtoFarad and a quenching resistance of 100 kOhm. This is especially suitable for individual photon counting.

The detector cells $M_{i,j}$ are all connected to each other in parallel electrically. If one or more microcells $M_{i,j}$ detects a photon Ph1, a trigger electron is triggered in the avalanche photodiode $D_{i,j}$ so that the avalanche effect is triggered. Due to the increasing cell current $I_{i,j}$ and the thereby increasing voltage drop at the respective quenching resistor $R_{i,j}$, the bias voltage $U_{i,j}$ at the avalanche photodiode(s) $D_{i,j}$ is reduced so strongly that the avalanche photodiode is quenched, i.e. blocks the current flow again. At the common terminal A at the base of the respective anode of the avalanche photodiodes $D_{i,j}$, it is possible to measure the total current I of all cell currents $I_{i,j}$ flowing in the individual microcells $M_{i,j}$, by means of which the charge avalanches triggered by the photons Phi in the avalanche photodiodes $D_{i,j}$ can be determined. For this reason, the common terminal or the output A is connected, for example, via a measuring or load resistor R1 to ground. Although the operation of the individual/single detector cell $M_{i,j}$ proceeds in a purely digital manner, the overall silicon photomultiplier works in an analog mode due to the parallel connections of the microcells $M_{i,j}$ to each other.

The embodiment in accordance with FIG. 1 represents an analog silicon photomultiplier (SiPM), at the output A of which energy and timing information is available. In an application of the silicon photomultiplier F (SiPM) in positron emission tomography (PET) detectors for evaluating scintillation events, two different signals have to be evaluated:
a) the timing information, i.e. especially the detection of the first photon(s) Ph1, and
b) the energy (amplitude information), i.e. the quantity of incident photons Ph1, Ph2.

The requirement for these two signals is different. While the timing information needs fast electronics and a high bandwidth, the energy information is evaluated by means of integration of the signal, which does not need a high bandwidth. In FIG. 1, both the timing information and the energy information are sampled from the same signal source at output A. This is not the optimal configuration for the timing information. The triggering at the first detected photon Ph1 or photons Ph1, Ph2 is especially difficult. Furthermore, the electronics for the timing trigger need a higher bandwidth than for the energy signal, which does not correspond to an optimal setting for the power consumption.

Figure 2:
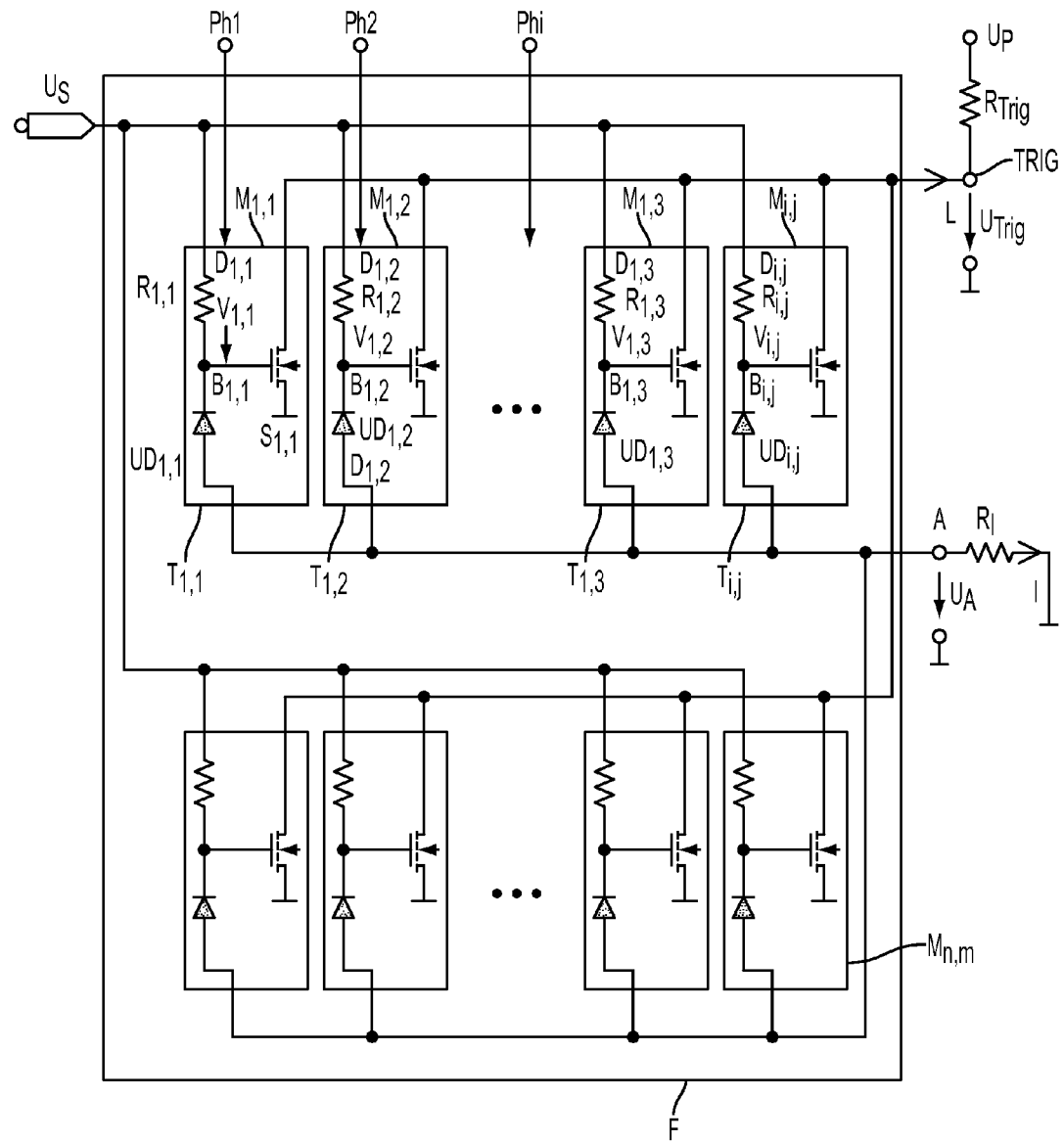
FIG. 2 is a diagram of a silicon photomultiplier with an amplifier in accordance with an embodiment of the present invention.

FIG. 2 shows an expansion of the silicon photomultiplier device in FIG. 1. Every microcell $M_{i,j}$ in FIG. 1 is assigned an amplifier element $T_{i,j}$, all amplifier elements $T_{i,j}$ preferably being constructed in one technology, for example in Complementary Metal Oxide Semiconductor (CMOS), N-type Complementary Metal Oxide Semiconductor (NMOS), P-type Complementary Metal Oxide Semiconductor (PMOS) or bipolar technology.

The high-impedance input $B_{i,j}$ of the amplifier element $V_{i,j}$ is connected to the node between the quenching resistor $R_{i,j}$ and the blocking terminal of the avalanche photodiode $D_{i,j}$ and captures the falling bias voltage $UD_{i,j}$ at the avalanche photodiode $D_{i,j}$. The respective amplifier elements $V_{i,j}$ are fed by means of a supply voltage Up via a common pull-up resistor RTrig via a trigger signal line TRIG, preferably in each case via the drain terminal $D_{i,j}$ of the amplifier element $V_{i,j}$ designed as a MOS transistor. An OR connection ("wired OR") of the states of all connected microcells is therefore available at the trigger signal line TRIG. The "source" output $S_{i,j}$ of the respective amplifier element $V_{i,j}$ is connected to ground.

The bases of the respective anodes of the avalanche photodiodes $D_{i,j}$ continue to be connected to the output A. As a result, the currents $I_{i,j}$ flowing through the respective avalanche photodiodes $D_{i,j}$ are summed up into the total current I. For the purpose of measuring the total current I, the output A is connected to ground via the measuring or load resistor R1 so that the total current I can be determined indirectly via the voltage drop UA at the load resistor R1.

The trigger voltage UTrig at the trigger signal line TRIG is reduced ("lower level") as soon as an amplifier element $V_{i,j}$ becomes at least partly conducting due to photon incidence on an avalanche photodiode $D_{i,j}$, which is explained in detail below.

The speed of the trigger signal line TRIG is primarily dictated by parasitic capacitive loads, which are proportional to the quantity of microcells $M_{i,j}$ that are connected to this trigger line TRIG.

Figure 3:
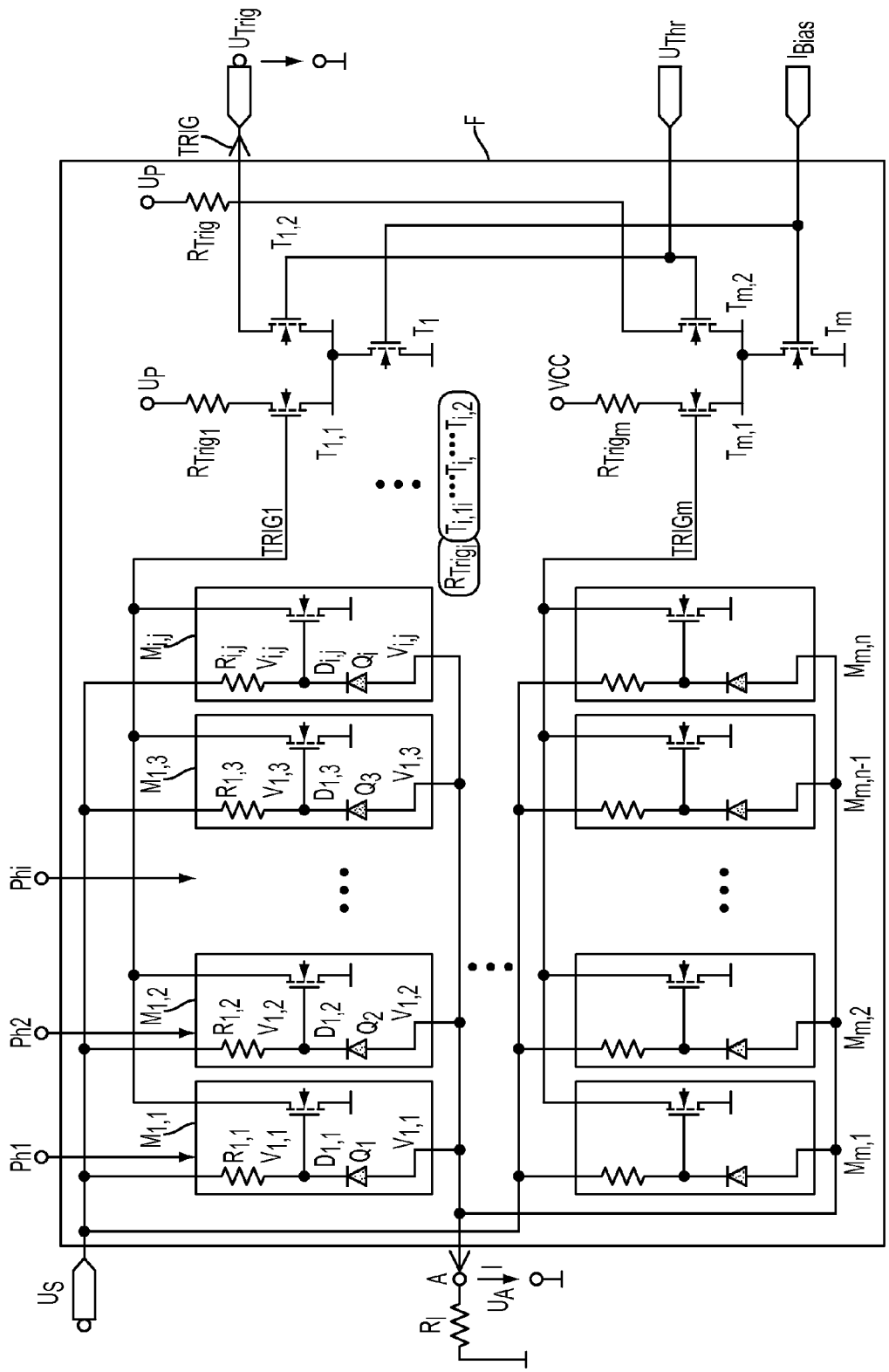
FIG. 3 is a diagram of the silicon photomultiplier in FIG. 2 with hierarchically structured amplifier electronics in accordance with an embodiment of the present invention.

For large-scale sensor arrangements, a hierarchical triggering scheme with mutually decoupled trigger signal lines TRIGi is employed for the purpose of reducing the parasitic capacitive loads on the trigger signal line TRIG, as represented in detail in FIG. 3. FIG. 3 shows a silicon photomultiplier device F as in FIG. 2, wherein one trigger signal line TRIGi is provided for each microcell row $M_{i,1}$; $M_{i,2}$; ...; $M_{i,n}$. The amplifier elements $V_{i,j}$ (drain) of a row i are supplied with a supply voltage Up via a respective amplifier stage $T_{i,1}$; $T_{i,2}$; Ti via a trigger signal line TRIG assigned in common to all rows 1, ..., i, ..., m via a common pull-up resistor RTrig. An amplifier stage $T_{i,1}$; $T_{i,2}$; Ti has three amplifier modules $T_{i,1}$; $T_{i,2}$; Ti, preferably designed as MOS transistors. Two amplifier modules $T_{i,1}$; $T_{i,2}$ are constructed as a current mirror circuit, while the third amplifier module Ti undertakes current impression in the common source branch of the two amplifier modules $T_{i,1}$; $T_{i,2}$, which is dependent on the control current IBias. The base of the first mirror module $T_{i,1}$ is in each case connected to the trigger signal line TRIGi serving the purpose of supplying the respective amplifier element $M_{i,1}$, ..., $M_{i,j}$, ..., $M_{i,n}$, and is supplied as necessary via the drain of the first mirror module $T_{i,1}$ that is connected to the feed voltage US via the pull-up resistor RTrigi. The drain of the second mirror transistor $T_{i,2}$ is connected to the common trigger signal line TRIG, which is connected to the (bias) feed voltage Up via a common pull-up resistor RTrig. The ground voltage level of the trigger signal lines TRIGi can be adjusted via the threshold voltage UThr, which is applied in common at the respective base of the second mirror modules $T_{i,2}$.

Functionally, the circuit in FIG. 3 works like the circuit in FIG. 2, the additional amplifier elements with current mirror circuit and current impression reducing the parasitic capacitances of the trigger signal line TRIG by means of subdivision into individual trigger signal lines TRIGi and decoupling.

Usually, all the microcells in a row M1,1, . . . , M1,n or a column M1,1, . . . , Mm,M in the matrix arrangement F are typically connected to an amplifier stage Ti,1; Ti,2; Ti.

The circuit in FIG. 3 preferably uses only NMOS transistors and resistors for all amplifier stages, i.e. the same devices that are already being used in the microcells Mi,j. By this means, these stages can also be integrated in monolithic fashion without raising the technological complexity.

Other embodiments of the amplifier circuits have only CMOS transistors or bipolar transistors or complete CMOS processes that are constructed in a similar manner to that specified in FIG. 3.

The avalanche effect generated upon the detection of a photon is only terminated by the lowering of the bias voltage UDi,j at the avalanche photodiode Di,j, which takes place with the aid of the quenching resistor Ri,j. The resetting, or re-charging, of an avalanche photodiode Di,j takes around 100 to 200 μs in this case at a capacitance of the avalanche photodiode Di,j of 100 fF (femtoFarad) and a quenching resistance Ri,j of 100 kOhm. This is especially suitable for individual photon counting.

FIGS. 4a and b show a general simulation carried out with the program SPICE of the voltage values at the common trigger signal line TRIG and the common output A of the photoelectric device F in FIG. 2 or 3 with circuit parameters that are used by an existing analog silicon photomultiplier device and are based on a 0.5 μm CMOS process. Parasitic capacitive effects on the trigger line TRIG in FIGS. 2 and 3 do not visibly influence the measurement curves in this example. It is assumed that a microcell Mi,j is struck by a photon Ph1 at the time point t1=1 ns (nanosecond) so that a corresponding electron avalanche is triggered.

The charge quantity Q transferred by the relevant avalanche photodiode Di,j can be determined by way of integration of the current I or the voltage UA at the load resistor R1. The associated measurement curves for the voltage UA measured/simulated at different load resistors R1 in the case of employing various load resistors R1=1 Ohm (square), 20 Ohm (diamond), 50 Ohm (triangle), and 100 Ohm (inverted triangle) are represented in FIG. 4. The area from t=1 ns to the end of the dead time and after the decay of Ri,j—C_Di,j —time constant (C_Di,j=capacitance of the avalanche photodiode Di,j) under the respective curves is proportional to the charge quantity transferred Q1. The rise time of the signal voltages UA comprises around 2 ns in each case. Furthermore, the influence of the optional arrival of a further photon Ph2 on a further avalanche photodiode Dx,y at the time point t=5 ns is represented in the measurement curve indicated by a "double diamond" at R=20 Ohm. A further charge quantity Q2 is transferred by the further avalanche photodiode Dx,y so that the total charge quantity Qges=Q1+Q2 is given by the aforementioned integration.

The simulation curve in FIG. 4b shows the trigger voltage/ trigger signal UTrig of the trigger line TRIG as a function of the time t. The trigger signal UTrig shows a clear step change after the arrival of the first photon Ph1 with a rise time or fall time of around 0.2 ns and a voltage drop of around 0.5 V. The shape of the curve UTrig is essentially independent of the charge quantity Q transferred by the relevant avalanche photodiode Di,j and the load resistor R1. The step change can simply be used to cause triggering with a high degree of timing resolution at the first photon Ph1. After the end of the dead time of >100 ns of the relevant avalanche photodiode (which cannot be represented true to scale), the original voltage value of approx. 3.3 is restored. As an option, the influence of the arrival of at least one further photon Ph2 on a further avalanche photodiode D1,2 at the time point t=5 ns is represented in the measurement curve indicated by a "double diamond" in FIG. 4b. A further voltage drop of around 0.5 V occurs with a step duration of around 0.2 ns. Correspondingly, further photons Phi can also strike further avalanche photodiodes Dxi,yi, the precise arrival time points of which can be read off from the measurement curve.

Excellent conclusions about events can be made from the determined arrival time points t1, t2, . . . , in FIG. 4b and the total charge quantity Qges in FIG. 4a, for example for evaluating scintillator events in scintillation crystals that are connected upstream of the silicon photomultiplier F. It is thus possible to distinguish between the direct incidence of one quantum of radiation with a high quantum energy on a scintillator crystal and Compton events with a plurality of radiation quanta with lower energies.

As can be seen from the measurement curves in FIG. 4a, b, the analog signal UA responds much more slowly (with a rise time of approx 2 ns)—by around a factor of 10 in this case— than the digital trigger signal UTrig (with a rise time/fall time of approx. 0.2 ns), but it is quite suitable for evaluating the total energy. The duration of capture of the charge quantity Q corresponds essentially to the dead time of the avalanche photodiode due to the integration of the current over time. The digital trigger signal line TRIG is not disturbed by the addition of external load resistors R1 for evaluating the transferred charge Qges and the analog charge signal UA is not disturbed by the digital trigger line TRIG.

The invention claimed is:

1. A Silicon Photomultiplier (SIPM), comprising:
    a plurality of microcells;
    a nonlinear element integrated in each one of the plurality of microcells;
    a trigger line for outputting a summated current of the plurality of microcells, wherein the nonlinear element provides for a separated timing and energy signal;
    a plurality of photodiodes wherein each one of the plurality of the photodiodes is coupled to a respective one of the plurality of microcells; and;
    a resistor connected in parallel with the photodiode and the nonlinear element.

2. The SiPM of claim 1, wherein the nonlinear element comprises a N-type metal oxide semiconductor (NMOS) transistor.

3. The SiPM of claim 1, wherein the nonlinear element comprises a P-type metal oxide semiconductor (PMOS) transistor.

4. The SiPM of claim 1, wherein the nonlinear element activates an output on the trigger line.

5. The SiPM of claim 1, wherein the timing signal and energy signal are not derived from a same summated signal.

6. The SiPM of claim 1, wherein the photodiode is an avalanche photodiode.

7. The SiPM of claim 1, wherein at least one of the plurality of photodiodes is reverse biased and in Geiger mode.

8. The SiPM of claim 1, wherein anodes of each of the plurality of photodiodes are connected to form an output line for capturing charges that are displaced in any of the plurality of microcells.

9. The SiPM of claim 1, wherein the nonlinear element comprises a complementary metal oxide semiconductor (CMOS) transistor.

10. A device for detecting radiation, comprising:
    a plurality of photosensitive microcells arranged in a row or matrix for detecting one or more photons;
    a plurality of avalanche photodiodes each one of the plurality of photodiodes being associated with a respective photosensitive microcell;

a plurality of quenching resistors wherein each quenching resistor is connected in series with a respective one of the plurality of avalanche photodiodes;

a plurality of amplifier elements wherein each amplifier element is located between a respective avalanche photodiode and quenching resistor in each one of the plurality of microcells;

a first trigger line for detecting at least one time point of an incidence of one or more photons within at least one of the plurality of photosensitive microcells; and a second trigger line for detecting charges that are generated within at least one of the plurality of photosensitive microcells by an incidence of one or more photons.

11. The device as in claim 10, wherein detection of the charges and time points are performed independently of each other.

12. The device as in claim 11, wherein anodes of each of the plurality of avalanche diodes are connected together to provide the second trigger line.

13. The device of claim 10, wherein the first trigger line comprises combined outputs of the plurality of avalanche diodes, outputs from the amplifier elements and outputs from the plurality of photosensitive microcells to form an OR signal line.

14. The device of claim 10, wherein the first trigger line is subdivided into a plurality to segments that are combined via amplifier stages into a single summated trigger signal.

15. The device of claim 10, wherein the plurality of amplifier elements are fabricated using CMOS.

16. The device of claim 10, wherein the plurality of amplifier elements are fabricated using NMOS.

17. The device of claim 10, wherein the plurality of amplifier elements are fabricated using PMOS.

18. The device of claim 10, wherein the plurality of amplifier elements are fabricated using bipolar technology.

* * * * *